(12) United States Patent
Hunter (10) Patent No.: US 11,375,640 B2
(45) Date of Patent: Jun. 28, 2022

(54) DATA CABINET

(71) Applicant: Jeff Hunter, Surrey (GB)

(72) Inventor: Jeff Hunter, Surrey (GB)

(*) Notice: Subject to any disclaimer, the term of this patent is extended or adjusted under 35 U.S.C. 154(b) by 0 days.

(21) Appl. No.: 16/496,798

(22) PCT Filed: Mar. 21, 2017

(86) PCT No.: PCT/GB2017/050791
§ 371 (c)(1),
(2) Date: Sep. 23, 2019

(87) PCT Pub. No.: WO2018/172724
PCT Pub. Date: Sep. 27, 2018

(65) Prior Publication Data
US 2020/0128697 A1   Apr. 23, 2020

(51) Int. Cl.
*H05K 7/20* (2006.01)

(52) U.S. Cl.
CPC ..... *H05K 7/20745* (2013.01); *H05K 7/20736* (2013.01)

(58) Field of Classification Search
CPC ............... H05K 7/20745; H05K 7/20736
See application file for complete search history.

(56) References Cited

U.S. PATENT DOCUMENTS

| | | | | |
|---|---|---|---|---|
| 8,544,289 B2* | 10/2013 | Johnson | ............. | H05K 7/20836 62/186 |
| 2004/0257766 A1* | 12/2004 | Rasmussen | ........ | H05K 7/20736 361/689 |
| 2009/0088873 A1* | 4/2009 | Avery | ..................... | G06F 1/206 700/51 |
| 2010/0317278 A1* | 12/2010 | Novick | .............. | H05K 7/20836 454/184 |
| 2014/0168887 A1* | 6/2014 | Lai | ..................... | H05K 7/20736 361/679.46 |
| 2015/0208554 A1* | 7/2015 | Leigh | ........................ | G06F 1/20 165/80.3 |
| 2017/0006729 A1* | 1/2017 | Tseng | ....................... | H05K 7/18 |

OTHER PUBLICATIONS

International Search Report and Written Opinion of the International Search Authority issued by ISA/EPO dated Nov. 28, 2017.

* cited by examiner

*Primary Examiner* — Mukundbhai G Patel
(74) *Attorney, Agent, or Firm* — CIONCA IP Law P.C.; Marin Cionca (57) ABSTRACT

A data cabinet is disclosed, having a cabinet body for enclosing one or more rack-mounted units, the cabinet body having an inlet for allowing a cooling medium to enter the cabinet and an outlet for allowing the cooling medium to exit the cabinet, a rack for supporting the one or more rack-mounted units within the cabinet body, and one or more sealing members. The rack and the cabinet body define a first plenum space in fluid communication with the inlet and a second plenum space in fluid communication with the outlet. The sealing members substantially block the cooling medium from flowing between the first and second plenum spaces, whilst permitting the cooling medium to flow from the first plenum space to the second plenum space through the one or more rack-mounted units. This arrangement can improve the cooling efficiency, by increasing the flow rate through the rack-mounted units.

16 Claims, 6 Drawing Sheets

DATA CABINET

TECHNICAL FIELD

The present invention relates to rack-mount data cabinets. More particularly, the present invention relates to cooling paths within rack-mount data cabinets.

BACKGROUND

Data cabinets for housing IT servers can offer dense hardware configurations in a relatively small footprint. For example, a standard 42U rack-mount cabinet can house up to 42 individual systems in 1U rack units, where U denotes one standard rack unit (44.50 mm). However, efficient cooling of rack-mount cabinets and the computing systems contained therein can be challenging, particularly when a large number of rack-mount cabinets are installed in the same facility, such as in a data hall, data centre or server farm.

Large rack-mount facilities are typically cooled by chilling air using air conditioning systems, and pumping the chilled air into the room in which the rack-mount cabinets are housed. The air conditioning system cools the whole volume of the space to the same level. The cool air supplied by the air conditioning system passes through floor vents in front of each row of cabinets and then enters the cabinets through perforations in the cabinet front door. The chilled air is then drawn into the cabinets by the server fans, where it absorbs heat from the internal computing components before being blown back into the room. The air conditioning system then pulls the warm air out of the room and expels the air to atmosphere.

A typical modern data centre may house data server racks which have a power density of between 7.5 kW (kilowatts) and 25 kW per rack. The overall density that can be achieved is totally dependent upon the supply infrastructure that feeds the data centre, and on the chosen cooling medium. The efficiency of the overall system can be as low as 25%.

The invention is made in this context.

SUMMARY OF THE INVENTION

According a first aspect of the present invention, there is provided a data rack cabinet comprising a cabinet body for enclosing one or more rack-mounted units, the cabinet body comprising an inlet for allowing a cooling medium to enter the cabinet and an outlet for allowing the cooling medium to exit the cabinet, a rack for supporting the one or more rack-mounted units within the cabinet body, the rack and the cabinet body being configured to define a first plenum space in fluid communication with the inlet and a second plenum space in fluid communication with the outlet, and one or more sealing members configured to substantially block the cooling medium from flowing between the first and second plenum spaces via the rack, whilst permitting the cooling medium to flow from the first plenum space to the second plenum space through the one or more rack-mounted units.

In some embodiments according to the first aspect, the one or more rack-mounted units are spaced apart from the cabinet body, and the one or more sealing members are further configured to substantially block the cooling medium from flowing between the first and second plenum spaces via the space between the rack-mounted units and the cabinet body.

In some embodiments according to the first aspect, the one or more sealing members are configured to form a hermetic seal around each of the one or more rack-mounted units, such that the cooling medium can only flow from the first plenum space to the second plenum space through the one or more rack-mounted units.

In some embodiments according to the first aspect, the one or more sealing members comprise a blanking plate configured to hermetically seal an unoccupied space in the rack.

In some embodiments according to the first aspect, the cabinet further comprises an aperture configured to allow one or more cables to pass through a wall of the cabinet body. For example, the cables may include power cables and/or data cables. The aperture may comprise a cable seal capable of conforming to the shape of one or more cables passing through the aperture, so as to restrict fluid flow through the aperture. In some embodiments, the cable seal may be configured to form an airtight seal around the one or more cables.

In some embodiments according to the first aspect, the cabinet body includes an opening for permitting access to an interior of the cabinet body, and the cabinet further comprises a door for closing said opening, and a door seal configured to form a substantially gastight seal around the door when closed.

In some embodiments according to the first aspect, the cabinet body is constructed from a plurality of separate components hermetically connected to one another. For example, adjacent ones of the plurality of components can be hermetically connected by welded joints. In such embodiments, the cabinet may further comprise one or more joint seals each configured to form a substantially gastight seal around a gap between the welded joints.

In some embodiments according to the first aspect, the inlet and/or the outlet may comprise a gasket configured to form a substantially gastight seal around the inlet or outlet when the cabinet is installed in the datacentre. The gasket may be configured to form a substantially gastight seal between the inlet and a floor tile beneath the cabinet.

In some embodiments according to the first aspect, the one or more sealing members comprises one or more first sealing members disposed on a first side of the rack, to form a seal with the first plenum space, and one or more second sealing members disposed on a second side of the rack, to form a seal with the second plenum space.

In some embodiments according to the first aspect, the cooling medium is air.

According a second aspect of the present invention, there is provided a facility comprising one or more data cabinets according to the first aspect, an inlet manifold configured to supply the cooling medium to respective inlets of the one or more cabinets, and an outlet manifold configured to receive the cooling medium from respective outlets of the one or more cabinets.

BRIEF DESCRIPTION OF THE DRAWINGS

Embodiments of the present invention will now be described, by way of example only, with reference to the accompanying drawings, in which.

DETAILED DESCRIPTION

In the following detailed description, only certain exemplary embodiments of the present invention have been shown and described, simply by way of illustration. As those skilled in the art would realize, the described embodiments may be modified in various different ways, all without departing from the scope of the present invention. Accordingly, the drawings and description are to be regarded as illustrative in nature and not restrictive. Like reference numerals designate like elements throughout the specification.

Figure 1:
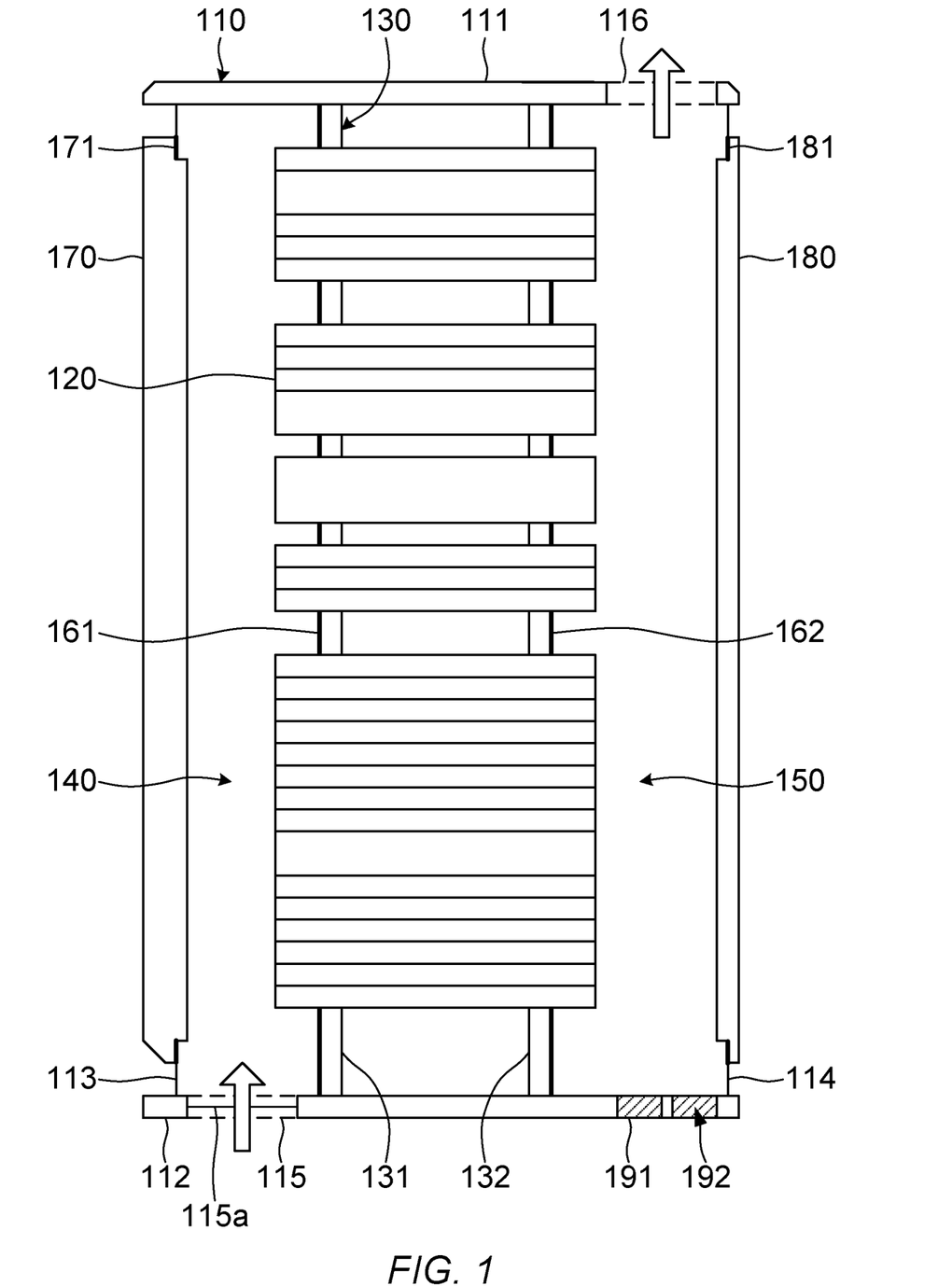
FIG. 1 illustrates a cross-section through a rack-mount cabinet, according to an embodiment of the present invention.

Referring now to FIG. 1, a cross-section through a rack-mount cabinet is illustrated according to an embodiment of the present invention. The rack-mount cabinet is configured to be cooled by way of a gaseous cooling fluid, for example air, and may therefore be referred to as an aircooled rack-mount cabinet.

As shown in FIG. 1, the rack-mount cabinet comprises a cabinet body no for enclosing one or more rack units 120. In the present embodiment, the cabinet body no is generally cuboid in shape and comprises a top panel 111, a bottom panel 112, a front panel 113, a rear panel 114, and left and right side panels (not shown in FIG. 1). However, in other embodiments the cabinet body no may take a different form, for example that of a prism or cylinder. In some embodiments in which the cabinet body is constructed from a plurality of separate components, the components may be joined by means of a substantially gastight seal in order to prevent the cooling medium from leaking out of the cabinet through joints between components. For example, the cabinet body may be constructed from metal sheets welded together. Any gaps between the welds may be sealed using suitable joint seals.

The cabinet body no further comprises an air inlet 115 and an air outlet 116. The air inlet 115 comprises an opening formed in the bottom panel 112, through which air may enter the cabinet. The air inlet 115 may further comprise a supply damper mechanism 115a for modulating the flow rate through the air inlet 115. For example, the supply damper mechanism 115a may comprise a plate that can be moved across the air inlet 115 in increments by a suitable actuator such as a stepper motor, so as to increase or decrease the cross-sectional area of the air inlet 115 and thereby modulate the flow rate. An airflow management system may be configured to automatically adjust the rate of air flow into the cabinet according to server workload. The air outlet 116 comprises an opening formed in the top panel 111, through which air may exit the cabinet. Although the present embodiment is described in relation to air cooling, in other embodiments a different gaseous cooling medium may be used, for example an inert gas.

The rack-mount cabinet further comprises a rack 130 for supporting one or more rack units 120 within the cabinet body no. In the present embodiment the rack 130 comprises a front frame 131 and a rear frame 132, which may be connected to one another by lateral members to form a rigid frame. The rack 130 may be configured to accept rack units 120 of standard heights, for example 1U, 2U, 3U, 4U and so on, and/or may be configured to accept rack units of non-standard heights. Furthermore, although a plurality of rack units 120 are illustrated in FIG. 1, in other embodiments the cabinet could only include a single rack unit.

As shown in FIG. 1, in the present embodiment the rack 130 is configured such that the rack 130 and the rack units 120 are spaced apart from the front and rear panels 113, 114 of the cabinet body no. In this way, the rack 130 and the cabinet body no define a first plenum space 140 and a second plenum space iso. The first plenum space 140 is bounded by the front panel 113 of the cabinet body no, the front frame 131 of the rack 130, and by portions of the top panel 111, bottom panel 112, and side panels of the cabinet body no. The second plenum space 150 is bounded by the rear panel 114 of the cabinet body no, the rear frame 132 of the rack 130, and by portions of the top panel in, bottom panel 112, and side panels of the cabinet body no. The first plenum space 140 is in fluid communication with the inlet 115, so that the first plenum space 140 may be filled with cool air introduced to the cabinet via the inlet 115. The second plenum space 150 is in fluid communication with the outlet 116, so that warm air from the rack units 120 which flows into the second plenum space 150 can be removed from the cabinet via the outlet 116.

The cabinet further comprises first and second sealing members 161, 162, which are disposed respectively on the front and rear frames 131, 132 of the rack 130. The first and second sealing members 161, 162 are each configured to substantially block the cooling fluid, in this case air, from flowing from the first or second plenum space 140, 150 into the frame of the rack 130, whilst permitting air to flow from the first plenum space 140 to the second plenum space 150 through the rack units 120 themselves. Providing sealing members 161, 162 on both sides of the rack 130 further increases the efficiency by preventing hot air from the second plenum space 150 building up around the rack-mount units 120, which would otherwise raise the temperature of the servers. However, in other embodiments one of the first and second sealing members 161, 162 may be omitted, as the first and second plenum spaces 140, 150 will still be separated by the remaining one of the first and second sealing members 161, 162.

Also, in embodiments in which the rack units are spaced apart from the cabinet body, the sealing members can be further configured to substantially block air from flowing between the first and second plenum spaces via the gap between the rack units and the cabinet body. The sealing members therefore ensure that all, or substantially all, of the cool air which enters the cabinet is used to cool the rack units 120 themselves. The first and second sealing members 161, 162 may each comprise a substantially gas-impermeable barrier formed from a suitable material, for example a metal sheet or polymer membrane. The flow of air through the cabinet is illustrated schematically in FIG. 2, with arrows showing the direction in which air flows through the cabinet after entering the first plenum space 140 via the inlet 115.

Figure 2:
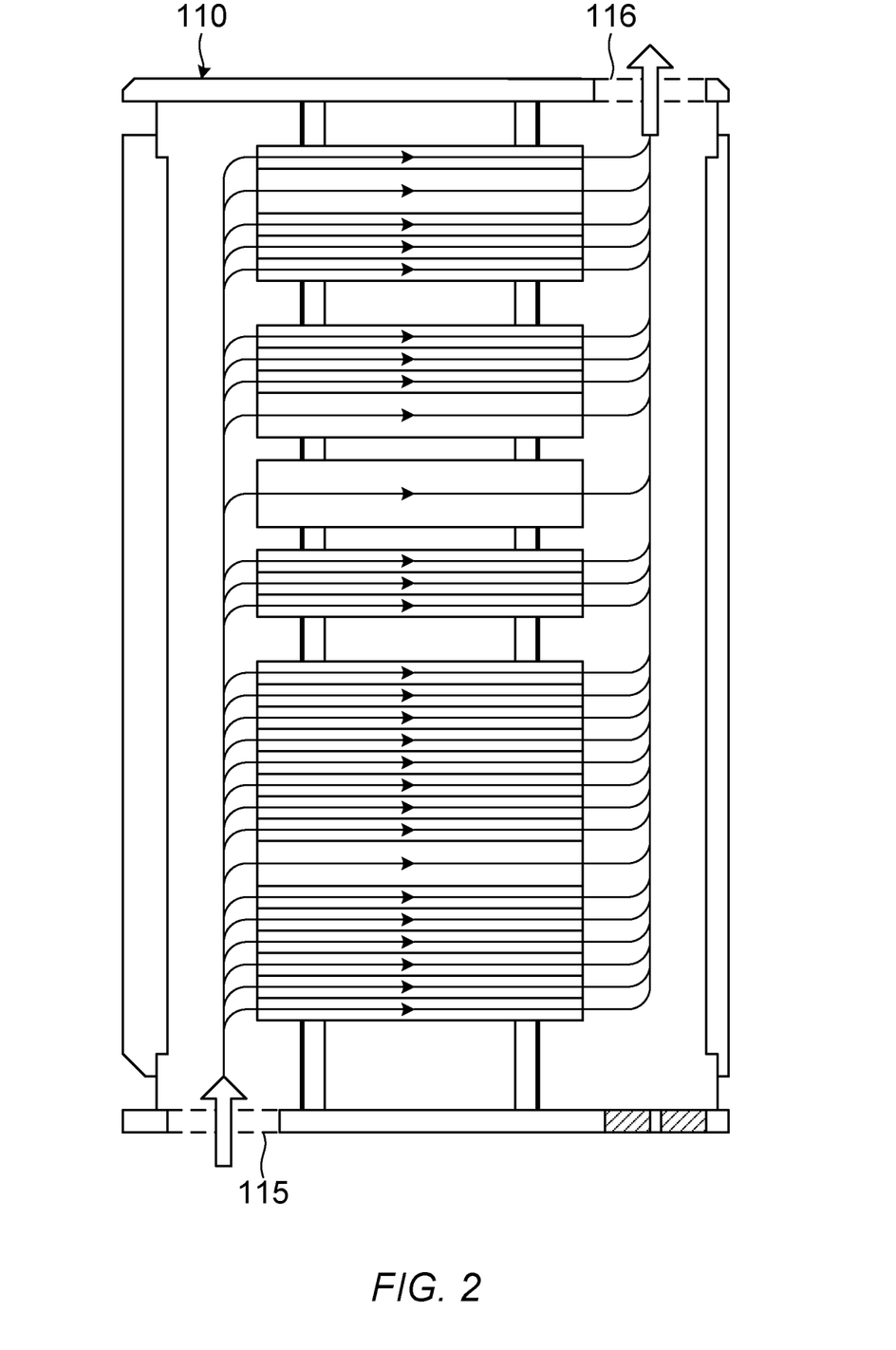
FIG. 2 illustrates air flow paths through the rack-mount cabinet of FIG. 1.

By providing sealing members 161, 162 which force air to flow through the rack units 120 rather than taking an alternative route from the air inlet 115 to the air outlet 116, as shown in FIG. 2, embodiments of the invention provide clearly defined airflow paths within the cabinet body. This ensures that more of the cool air which enters the cabinet is used to cool the rack units 120. As a result, the total flow rate through the facility can be reduced while still providing the same level of cooling. In contrast, in conventional cabinets a significant amount of air may bypass the rack units entirely due to the uncontrolled and undefined cooling paths within the cabinet. For example, in a conventional cabinet, cool air which enters the cabinet may flow through perforations in the frame of the rack or may flow through a space between the sides of the rack units and the walls of the cabinets, without being used to cool internal components within the rack units 120 themselves. For example, a conventional data centre may require a total air flow rate of 300 m$^3$/s in order to cool the room in which the server cabinets are located, whereas a data centre according to an embodiment of the present invention may only require an air flow rate of 100 m$^3$/s in order to achieve the same level of cooling.

Embodiments of the present invention can therefore extract more heat energy from the rack units 120 for a given air flow rate through the cabinet, providing a performance improvement in comparison to conventional aircooled rack-mount cabinets. In addition, embodiments of the present invention can allow a positive pressure difference to be maintained between the interior and exterior of the cabinet, by sealing any openings or joins in the cabinet body no. A positive pressure difference means that there is a higher air pressure within the cabinet body no, and can help to prevent dust from entering the cabinet and the server equipment within the rack-mounted units 120.

Continuing with reference to FIG. 1, in the present embodiment the plurality of rack units 120 protrude through openings in the first and second sealing members 161, 162. In other embodiments, the first sealing member 161 and/or the second sealing member 162 may be flush with the faces of the rack units 120. For example, the front and rear frames 131, 132 of the rack may be spaced further apart so that one or both of the front and rear frames 131, 132 lies flush with the faces of the rack units 120. Alternatively, the first sealing member 161 and/or the second sealing member 162 may be spaced apart from the rack 120, rather than being disposed on the face of the rack 120 as in the present embodiment.

In some embodiments, the cabinet may further comprise one or more apertures which are configured to allow cables, such as power cables or data cables, to pass through a wall of the cabinet body. In the present embodiment two such apertures 191, 192 are provided, as shown in FIGS. 1 and 2. Furthermore, in some embodiments the aperture 191, 192 can include a cable seal which is capable of conforming to the shape of one or more cables passing through the aperture, so as to restrict fluid flow through the aperture. For example, a suitable cable seal may be formed from a compliant foam material. The cable seal can provide a more effective seal around the aperture, further reducing leakage of air from the cabinet into the surrounding environment.

The cable aperture may be disposed at a low level in the cabinet. Cool air which enters the cabinet will tend to rise towards the top of the cabinet as it is heated by the rack units 120 and expands. Consequently, disposing the cable apertures at a low level in the cabinet can help to avoid warm air from inside the cabinet leaking into the surrounding environment. When the cabinet is installed in an air-conditioned room, such as a datacentre, this can help to maintain a low ambient temperature outside of the cabinet, reducing the load on the air conditioning system.

Furthermore, in some embodiments the cabinet may comprise additional seals to prevent air from leaking out of the cabinet and into the surrounding environment. For example, in some embodiments the cabinet may include one or more openings through which the interior of the cabinet body can be accessed in order to perform maintenance tasks, such as rerouting cabling and removing or replacing rack units. In the present embodiment, as shown in FIG. 1, the cabinet includes doors 170, 180 installed in respective openings in the front panel 113 and rear panel 114 of the cabinet body 110. Each opening is provided with a door seal 171, 181 which is configured to form a substantially gastight seal around the door 170, 180 once it is closed. Like the cable seal, the door seals 171, 181 help to stop air within the cabinet body no from leaking out into the surrounding environment.

In addition, the door seal 171 at the front of the cabinet can help to maintain a pressure difference between the first plenum space 140 and the outside environment. This allows the first plenum space 140 to be pressurised by pumping cool air in via the inlet 115 at greater than atmospheric pressure, maintaining a positive pressure within the cabinet body no and increasing the flow rate through the rack units 120. Similarly, the door seal 181 at the rear of the cabinet can help to maintain a positive pressure within the cabinet body no. The door seal 181 at the rear can also prevent warm air in the second plenum space 150 from leaking into the surrounding environment, thereby helping to maintain a low ambient temperature outside the cabinet.

In some embodiments, the cabinet may be anechoically and/or hermetically sealed to ensure that all cool air which enters the cabinet must flow through the rack units 120, maximising the cooling efficiency. Depending on the embodiment, the sealing members 161, 162 and any other seals included in the cabinet, such as door seals 171, 181 and any cable seals, may be configured to form a fully anechoic or hermetic seal, or a substantially anechoic or hermetic seal. Here, 'substantially' means that the seal permits leakage of no more than 5% of the total volume of airflow through the cabinet. A further benefit of anechoically and/or hermetically sealing the cabinet is that the cabinet may be direct injected with a gas suppressant system or oxygen depletion system in order to extinguish a fire within the cabinet.

Figure 3A:
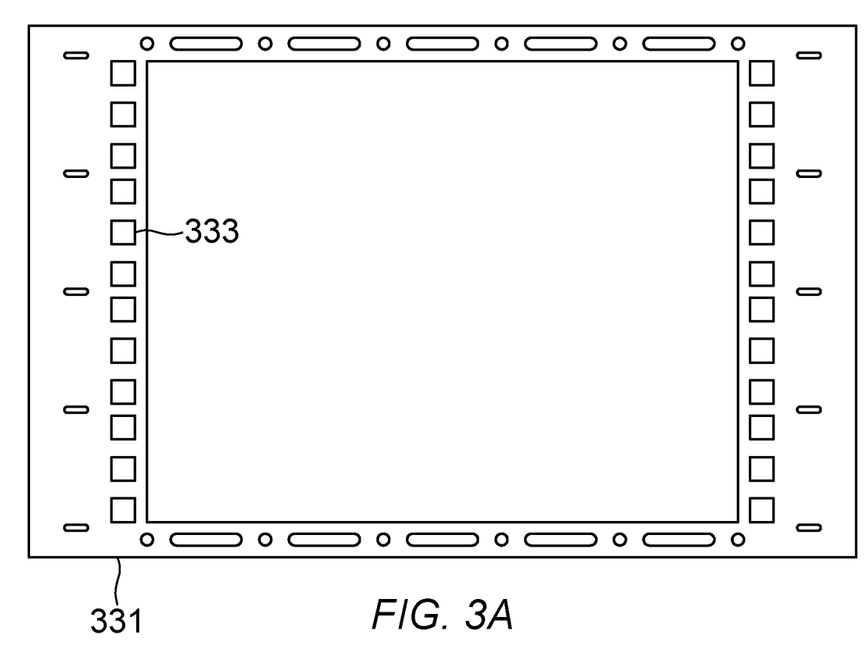
FIG. 3A illustrates a front frame of an empty rack, according to an embodiment of the present invention.
Figure 3B:
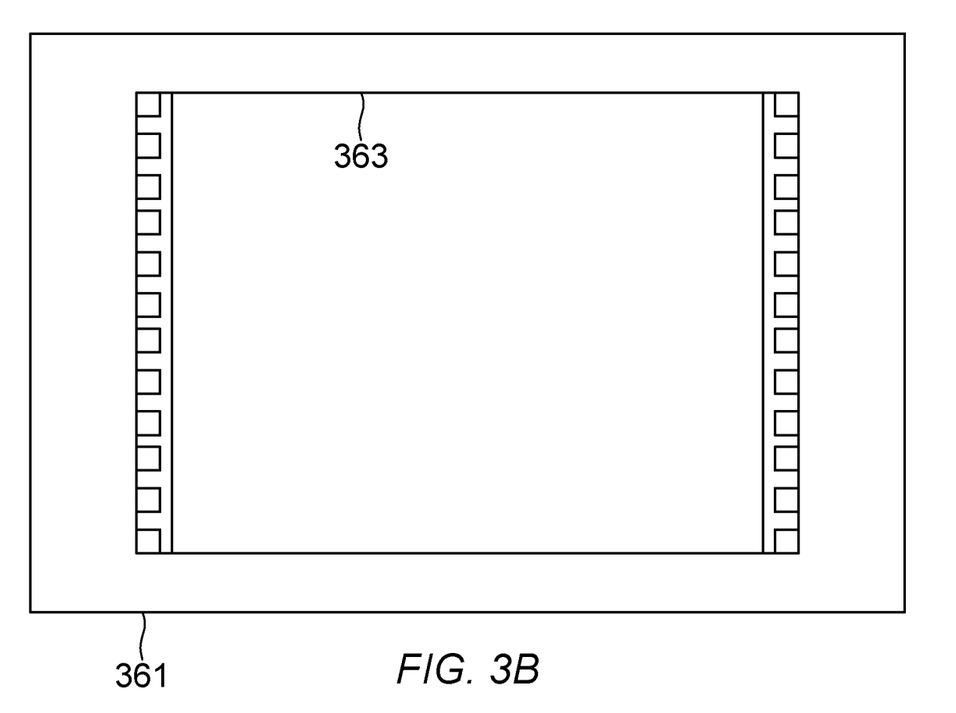
FIG. 3B illustrates a sealing member installed over the front frame of the rack, according to an embodiment of the present invention.

The function of the sealing members 161, 162 will now be explained with reference to FIGS. 3A to 3D. As shown in FIG. 3A, the rack frame 331 generally includes perforated front and/or rear plates which comprise a plurality of openings 333. These openings 333 enable rack units to be screwed into the rack, and cables to be routed through the rack. In a conventional rack-mount cabinet, the perforations in the rack provide alternative airflow paths which allow air that could otherwise be used for cooling to bypass the rack units entirely. Accordingly, in the present embodiment a sealing member in the form of a polymer membrane 361 is arranged so as to cover the openings 333 in the frame 331 of the rack, as shown in FIG. 3B. The sealing member 361 includes an opening 363 through which rack units 120 may be inserted into the rack.

Figure 3C:
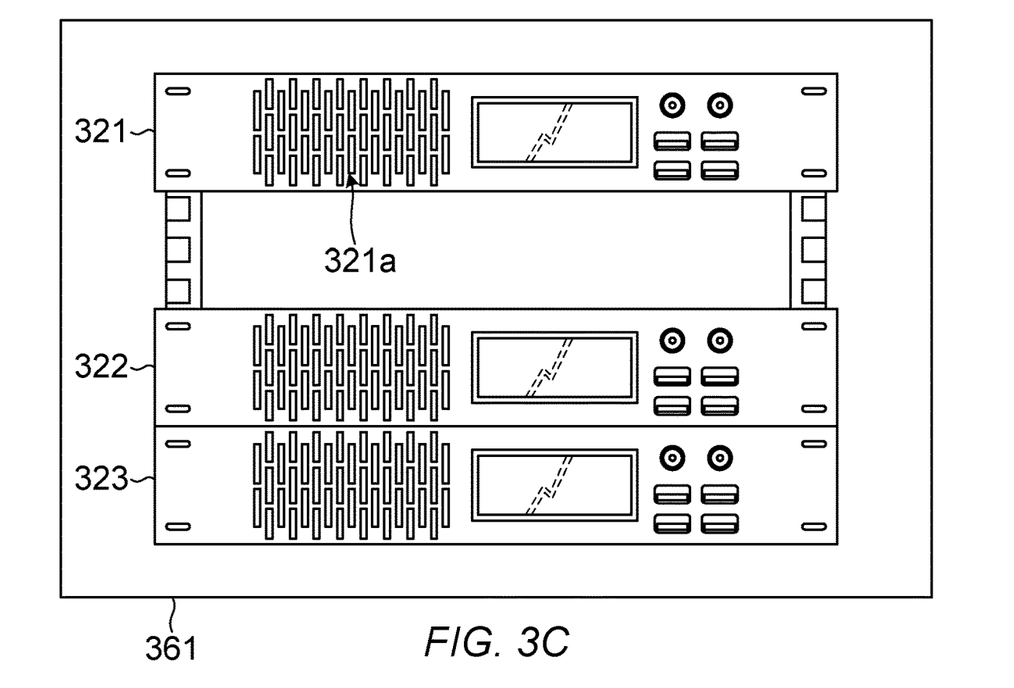
FIG. 3C illustrates a plurality of rack units installed against the sealing member, according to an embodiment of the present invention.

FIG. 3C illustrates a plurality of rack units 321, 322, 323 installed against the sealing member 361. In the present embodiment, each rack unit 321, 322, 323 comprises a faceplate which extends from either side of the rack unit 321, 322, 323 and overlaps the sealing member 361. The sealing member 361 can be formed from a material which, when compressed between the faceplates of the rack units 321, 322, 323 and the rack frame 331, forms a substantially gastight seal. For example, the sealing member 361 may be formed from a soft compressible material such as high density phenolic type compressible foam. Preferably a hermetic seal is achieved, although in some embodiments a certain amount of air leakage may be acceptable.

As shown in FIG. 3C, each rack unit 321, 322, 323 comprises a plurality of vents 321a through which air may enter rack unit 321, 322, 323. Since the sealing member 361 blocks alternative air flow paths between the first and second plenum spaces 140, 150, cool air contained in the first plenum space 140 can only exit the cabinet by flowing through the rack units 321, 322, 323 via the air vents 321a in the faceplates of the rack units 321, 322, 323.

Figure 3D:
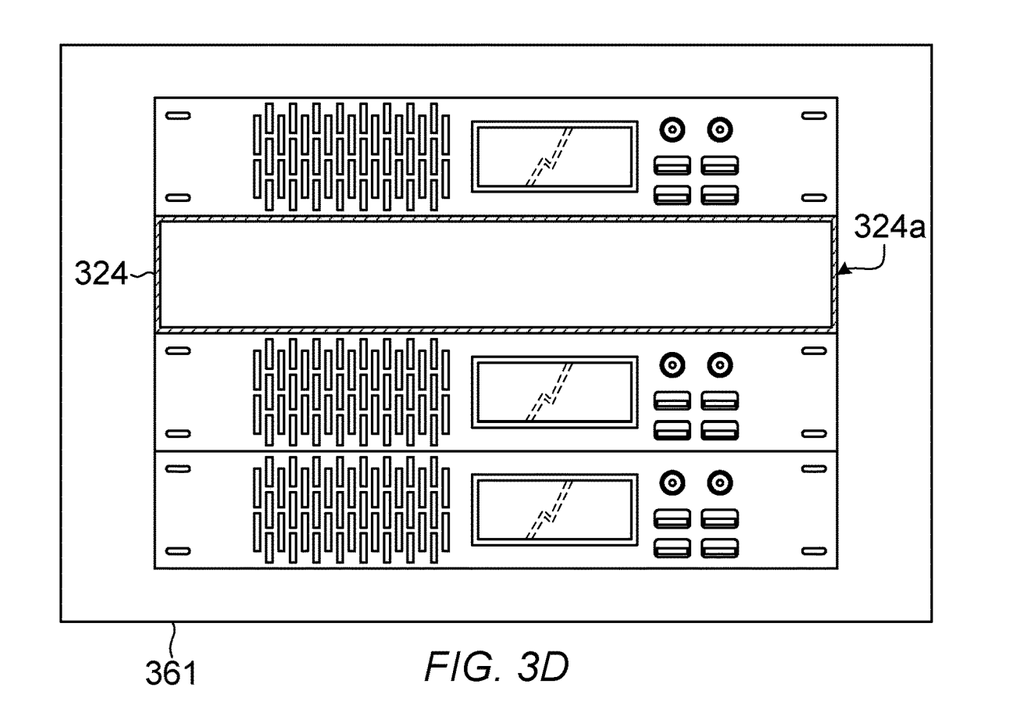
FIG. 3D illustrates a faceplate configured to hermetically seal an unoccupied space in the rack, according to an embodiment of the present invention.

Additionally, in some cases it is possible that the rack space in the cabinet may not be fully occupied. That is, there may be one or more unoccupied spaces within the rack. In such a scenario, the unoccupied space would provide an alternative path for air to flow freely between the first plenum space 140 and the second plenum space 150. Accordingly, in some embodiments of the present invention a blanking plate 324 may be used to seal an unoccupied space in the rack, as shown in FIG. 3D. The blanking plate 324 may preferably comprise a gasket 324a for forming a hermetic seal between the blanking plate 324 and the rack 331. The gasket 324a may be formed from any suitable material. For example, the gasket 324a may be formed from a soft compressible material such as high density phenolic type compressible foam.

Figure 4:
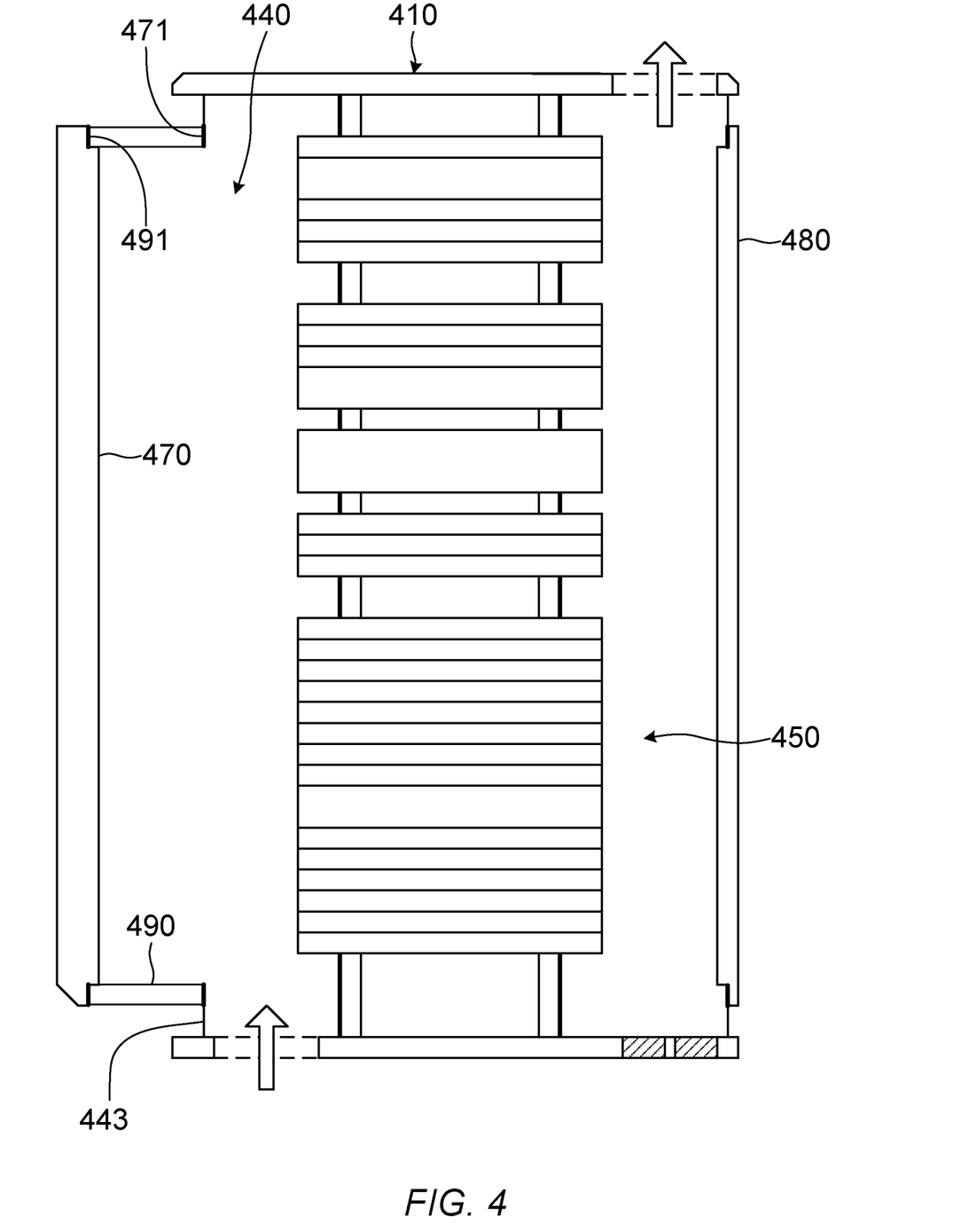
FIG. 4 illustrates a cross-section through a rack-mount cabinet, according to an alternative embodiment of the present invention.

Referring now to FIG. 4 a rack-mount cabinet according to an alternative embodiment of the present invention is illustrated in cross-section. The cabinet of this embodiment is similar in many respects to the embodiment shown in FIG. 1, and a detailed description of similar features will not be repeated here. In the embodiment of FIG. 4, a plenum extension member 490 is attached to the front panel 443 of the cabinet body 410 in place of the front door 470. The plenum extension member 490 is formed so as to increase the volume of the first plenum space 440 when attached to the cabinet in place of the door 470. In such embodiments, the door seal 471 can provide an airtight seal between the plenum extension member 490 and the front panel 443 of the cabinet body 410.

In the present embodiment, the plenum extension member 490 comprises an opening to which the door 470 can be attached, and comprises a second door seal 491 similar to the first door seal 471. Alternatively, the plenum extension member 490 may be attached to the front panel 443 of the cabinet body 410 via the same hinge mechanism that can be used to attach the door 470 to the front panel 443, so that the plenum extension member 490 can be swing open in order to permit access to the interior of the cabinet. The plenum extension member 470 and the door 490 may be configured so as to be interchangeable with one another.

An arrangement as shown in FIG. 4 can enable the volume of the cabinet to be expanded on the front elevation inlet side, that is, the side of the cabinet comprising the first plenum space 440, to provide room for larger cooling medium flow. By providing an interchangeable door 470 and plenum extension member 490, this can be achieved without the need to remove the cabinet from its final location. Furthermore, in other embodiments a plenum extension member may be attached to the rear of the cabinet in place of the rear door 480, to increase the volume of the second plenum space 450.

Figure 5:
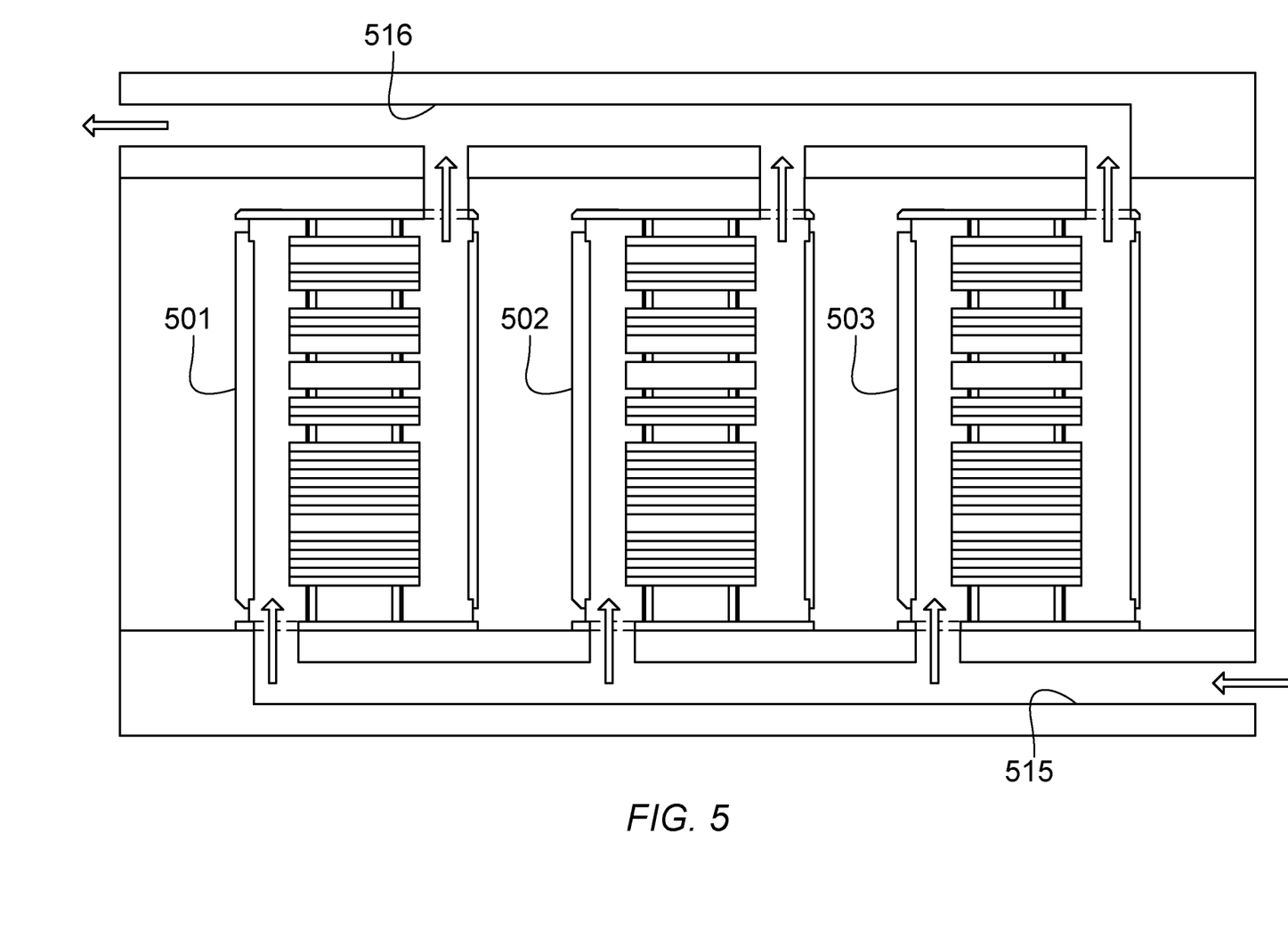
FIG. 5 illustrates a plurality of rack-mount cabinets installed in a datacentre, according to an embodiment of the present invention.

Referring now to FIG. 5, a datacentre comprising a plurality of rack-mount cabinets is illustrated, according to an embodiment of the present invention. For clarity only three cabinets 501, 502, 503 are illustrated in FIG. 5, but the actual number of cabinets included in a datacentre may be much higher. For example, a typical datacentre may comprise 10 halls each containing 1500 cabinets, giving a total of 15,000 cabinets. Embodiments of the present invention are not limited to use in data centres. For example, other types of facility in which embodiments of the present invention may be installed include, but are not limited to, data halls, server rooms, data communications facilities, and social media storage facilities.

As shown in FIG. 5, in the present embodiment the inlet of each cabinet 501, 502, 503 is connected to an inlet manifold 515 which is configured to supply cool air to the cabinets 501, 502, 503. The inlet manifold 515 may be disposed beneath the floor level of the room in which the cabinets 501, 502, 503 are housed, and each cabinet can further include an inlet gasket which forms a hermetic seal between the inlet and a floor tile beneath the cabinet, where the floor tile includes a vent through which cool air can be pumped into the cabinet.

In addition, in the present embodiment the outlet of each cabinet 501, 502, 503 is connected to an outlet manifold 516 which receives warm air from the respective outlets and carries the warm air away from the cabinets 501, 502, 503. For example, the outlet manifold 516 may be accommodated in a void above a suspended ceiling. As with the inlet manifold 515, a gasket may be provided between each cabinet outlet and the outlet manifold 516 in order to provide an effective seal. Furthermore, in some embodiments the inlet and outlet manifolds 515, 516 may be connected to a refrigeration system, such as an air conditioning system, which cools the warm air from the outlet manifold 516 and pumps the cooled air back into the inlet manifold 515.

In some embodiments only one of the inlet and outlet manifolds 515, 516 may be provided. For example, the cabinets 501, 502, 503 could be configured to receive cool air from a shared inlet manifold 515, and then expel warm air directly into the surrounding environment. Alternatively, the cabinets 501, 502, 503 could be configured to draw in cool air directly from the surrounding environment without being connected to a shared inlet manifold, but could still be connected to an outlet manifold 516 to carry warm air away from the cabinets 501, 502, 503 and maintain a low ambient temperature.

Whilst certain embodiments of the invention have been described herein with reference to the drawings, it will be understood that many variations and modifications will be possible without departing from the scope of the invention as defined in the accompanying claims.

The invention claimed is:

1. A data cabinet comprising:
   a cabinet body for enclosing one or more rack-mounted units, the cabinet body comprising an inlet for allowing a cooling medium to enter the cabinet and an outlet for allowing the cooling medium to exit the cabinet, wherein the outlet is configured to be connected to an outlet manifold for carrying the cooling medium away from the data cabinet;
   a rack for supporting the one or more rack-mounted units within the cabinet body, the rack and the cabinet body being configured to define a first plenum space in fluid communication with the inlet and a second plenum space in fluid communication with the outlet; and
   one or more sealing members configured to substantially block the cooling medium from flowing between the first and second plenum spaces via the rack, whilst permitting the cooling medium to flow from the first plenum space to the second plenum space through the one or more rack-mounted units,
wherein the one or more sealing members comprises:
a blanking plate configured to substantially or fully hermetically seal an unoccupied space in the rack,
wherein the data cabinet further comprises:
an aperture configured to allow one or more cables to pass through a wall of the cabinet body;
a cable seal capable of confirming to the shape of one or more cables passing through the aperture, so as to restrict fluid flow through the aperture;
an opening or permitting access to an interior of the cabinet body;
a door for closing said opening; and
a door seal configured to form a substantially gastight seal around the door when closed;
wherein the one or more sealing members, the cable seal and the door seal are each configured to form an anechoic and hermetic seal, such that the data cabinet is anechoically and hermetically sealed from a surrounding environment.

2. The cabinet of claim 1, wherein the one or more rack-mounted units are spaced apart from the cabinet body, and the one or more sealing members are further configured to substantially block the cooling medium from flowing between the first and second plenum spaces via the space between the rack-mounted units and the cabinet body.

3. The cabinet of claim 1, wherein the one or more sealing members are configured to form a hermetic seal around each of the one or more rack-mounted units, such that the cooling medium can only flow from the first plenum space to the second plenum space through the one or more rack-mounted units.

4. The cabinet of claim 1, wherein the one or more cables are power cables and/or data cables.

5. The cabinet of claim 1, wherein the cabinet body is constructed from a plurality of separate components hermetically connected to one another.

6. The cabinet of claim 5, where adjacent ones of the plurality of components are hermetically connected by welded joints, and the cabinet further comprises:
one or more joint seals each configured to form a substantially gastight seal around a gap between the welded joints.

7. The cabinet of claim 1, wherein the inlet comprises:
an inlet gasket configured to form a substantially gastight seal around the inlet when the cabinet is installed in a datacentre.

8. The cabinet of claim 7, wherein the gasket is configured to form a substantially gastight seal between the inlet and a floor tile beneath the cabinet.

9. The cabinet of claim 1, wherein the one or more sealing members comprises:
one or more first sealing members disposed on a first side of the rack, to form a seal with the first plenum space; and
one or more second sealing members disposed on a second side of the rack, to form a seal with the second plenum space.

10. The cabinet of claim 1, wherein the cooling medium is air.

11. A facility comprising:
one or more data cabinets according to claim 1;
an inlet manifold configured to supply the cooling medium to respective inlets of the one or more data cabinets; and
an outlet manifold configured to receive the cooling medium fluid from respective outlets of the one or more data cabinets.

12. The facility of claim 11, wherein each of the one or more data cabinets comprises:
an outlet gasket configured to form a substantially gastight seal between the respective outlet of said one of the data cabinets and the outlet manifold.

13. The facility of claim 11, wherein the outlet manifold is accommodated in a void above a ceiling of a room in which the one or more data cabinets are installed.

14. The cabinet of claim 1, further comprising:
an outlet gasket configured to form a substantially gastight seal around the outlet when the cabinet is installed in a datacentre.

15. The cabinet of claim 1, wherein the blanking plate comprises a gasket for forming said substantially or fully hermetic seal between the blanking plate and the rack.

16. The cabinet of claim 15, wherein the gasket is formed of a soft compressible material.

* * * * *